United States Patent [19]

Morimoto

[11] Patent Number: 5,149,973
[45] Date of Patent: Sep. 22, 1992

[54] APPARATUS FOR WIRING SEMICONDUCTOR DEVICE USING ENERGY BEAM AND WIRING METHOD BY USING THE SAME

[75] Inventor: Hiroaki Morimoto, Hyogo, Japan

[73] Assignee: Mitsubishi Denki Kabushiki Kaisha

[21] Appl. No.: 723,094

[22] Filed: Jun. 28, 1991

[30] Foreign Application Priority Data

Jul. 2, 1990 [JP] Japan .................... 2-175799

[51] Int. Cl.⁵ .......................... H01J 37/317
[52] U.S. Cl. ................. 250/492.2; 250/492.3
[58] Field of Search ........... 250/492.21, 492.2, 492.3

[56] References Cited

U.S. PATENT DOCUMENTS

| 4,457,803 | 3/1984 | Takigawa | 156/626 |
| 4,609,809 | 2/1986 | Yamaguchi et al. | 219/121 EM |
| 4,874,947 | 10/1989 | Ward et al. | 250/492.2 |

FOREIGN PATENT DOCUMENTS 61-245553  2/1986  Japan .

OTHER PUBLICATIONS

M. Yamamoto et al., "Submicron Mask Repair Using Focused Ion Beam Technology", SPIE vol. 632, Electron Beam, X-Ray & Ion-Beam Techniques for Submicrometer Lithographies V (1986), pp. 97–103.

Primary Examiner—Jack I. Berman

[57] ABSTRACT

Disclosed are an apparatus for wiring a semiconductor device and a wiring method therefor which allow a manufacturing step to be simplified without deteriorating an insulation characteristic of an aerial wiring. The semiconductor device wiring apparatus includes a first beam column 1a disposed above a substrate 50 and a second beam column 1b disposed horizontally thereto. Therefore, a wiring portion of the aerial wiring to be formed upwardly is formed by using the first beam column 1a and a wiring portion to be formed horizontally to wiring layer of the substrate 50 is formed by using the second beam column, which results in that no insulating film for the aerial wiring is required to simplify manufacturing steps.

9 Claims, 10 Drawing Sheets

APPARATUS FOR WIRING SEMICONDUCTOR DEVICE USING ENERGY BEAM AND WIRING METHOD BY USING THE SAME

BACKGROUND OF THE INVENTION

1. Field of the Invention

The present invention relates generally to apparatuses for wiring semiconductor devices and wiring methods using the same. More particularly, the present invention relates to apparatuses for wiring semiconductor devices which apparatuses form wirings through energy beam irradiation by supplying to the semiconductor devices such a reactive gas as forms a conductive material constituting a wiring through energy beam irradiation and it relates to wiring methods using those apparatuses.

2. Description of the Background Art

Conventionally known is a technique for repairing (making holes in a protection film, disconnection and connection of wirings) LSI chips on wafers or mounted in packages being semiconductor process with a precision below the order of micron by using a focused ion beam (FIB). This technique is necessary for repairing a defective part or analyzing a defect. The method of connecting wirings includes decomposition of the adsorbed gas and deposition of the decomposed material on a surface, which is obtained by irradiating with FIB a sample adsorbing a gas placed under a gas atmosphere of a certain type. The film deposited on the surface forms a wiring.

FIG. 11 is a schematic view showing an arrangement of a conventional LSI wiring apparatus. With reference to FIG. 11, the arrangement of the conventional LSI wiring apparatus will be described. The LSI wiring apparatus comprises an ion beam column 101 for emitting, focusing, and deflecting a focused ion beam, a sample chamber 102, a reactive gas nozzle 103 for feeding a reactive gas to a substrate 150 on which wirings are formed, and a sample stage 104 on which substrate 150 is placed. Ion beam column 101 comprises an ion source 110 including a liquid metal ion source or the like, a beam extracting electrode 111 for extracting an ion beam from ion source 110, an electrostatic lens 112 for focusing the ion beam extracted by beam extracting electrode 111, a beam blanking electrode 113 for turning on/off focused ion beam 110 focused by electrostatic lens 112 and a beam deflector 114 for deflection scanning of focused ion beam 100.

For the emission of focused ion beam 100 by ion beam column 101, first, a negative voltage is applied to beam extracting electrode 111 with respect to ion source 110 to emit an ion beam. The emitted ion beam is focused by electrostatic lens 112 to become focused ion beam 100. Beam deflector 114 directs the focused ion beam onto a desired position of substrate 150. Focused ion beam 100 is turned on/off by applying a voltage to beam blanking electrode 113 to largely deflect the beam.

FIGS. 12A to 12C are diagrams showing in three dimensions operations in a wiring forming process by using a conventional LSI wiring apparatus shown in FIG. 11. Referring to FIGS. 12A to 12C, conventional wiring forming operations will be described. As shown in FIG. 12A, wiring layers 150a and 150b comprising Al are formed apart from each other at a predetermined interval on substrate 150. In forming a connection wiring for connecting wiring layers 150a and 150b, tungsten hexacarbonyl [W(CO)$_6$], for example, is fed through reactive gas nozzle 103 (see FIG. 11) to a position at which the connection wiring should be formed. As shown in FIG. 12B, focused ion beam 100 shifts along the position on which connection wiring 151 should be formed while irradiating the same. Such operations eventually form connection wiring 151 as shown in FIG. 12C. Herein, used as focused ion beam 100 is Ga ion beam having energy of 20 KeV, a beam diameter of 1 μm and a beam current of 3 nA, for example. The irradiation energy of focused ion beam 100 in use decomposes W(CO)$_6$ molecules adsorbed on substrate 150 surface, thereby depositing a W film (tungsten film) of about 1 μm thickness on the portion irradiated by focused ion beam 100 with an ion beam radiation dose of $10^{18}/cm^2$.

As described above, a desired connection wiring 151 is formed by supplying a reactive gas to a position at which the desired connection wiring 151 should be formed and directing focused ion beam 100 thereto in the conventional LSI wiring apparatus.

While with such a conventional LSI wiring apparatus, it is easy to a form a connection wiring connecting two adjacent wiring layers, it is difficult to form a connection wiring connecting a plurality of wiring layers at the opposite sides with an intermediate wiring layer provided therebetween.

FIG. 13A is a plan view of a wiring layer explaining the problem of a conventional LSI wiring apparatus and FIG. 13B is a perspective view of the wiring layer shown in FIG. 13A. With reference to FIGS. 13A and 13B, for connecting wiring layers 150a and 150b when wiring layers 150a, 150c and 150b are arranged as shown in these drawings, a connection wiring should be formed to cross over 150c, which is difficult to be achieved by a conventional LSI wiring apparatus.

Therefore, conventionally proposed is the LSI wiring apparatus shown in FIG. 11 wherein an insulating reaction gas for forming an insulating pattern can be also supplied from reactive gas nozzle 103 in addition to a conductive gas for forming a connection wiring. That is, proposed is the technique of forming a connection wiring crossing over a wiring layer with an insulating pattern formed between the wiring layer to be crossed over and the connection wiring. This technique is disclosed in Japanese Patent Laying Open No. 61-245553, for example.

FIGS. 14A to 14C are diagrams showing the formation process explaining wiring forming operations of the conventional improved LSI wiring apparatus. With reference to FIGS. 14A to 14C, description will be made of a formation of a connection wiring between wiring layers 150a and 150b when wiring layers 150a, 150b and 150c are provided as shown in the drawings. That is, with the wiring layers arranged as shown in FIG. 14A, an insulating pattern 160 is formed by supplying a gas forming a insulating material through a reactive gas nozzle (not shown) onto wiring layer 150c and directing a focused ion beam (not shown) thereto as shown in FIG. 14B. Then as shown in FIG. 14C, supply of a reactive gas forming a conductive material and irradiation of a region between wiring layers 150a and 150b with a focused ion beam result in a formation of a connection wiring 151 therebetween. In the conventional example of an improvement as described in the foregoing, when it includes three wiring layers, wiring layers at opposite sides are connected crossing over the intermediate wiring layer to form a connection wiring by supplying an insulating reactive gas onto the intermediate wiring layer to form an insulating pattern thereon. A connection wiring (an aerial wiring) for connecting the opposite side wiring layers formed on the insulating pattern results in a wiring crossing over a wiring layer without short-circuit.

The conventional improved LSI wiring apparatus, however, has the complicated process for forming connection wirings. That is, the conventional example of an improvement requires additional process of forming an insulating film for an aerial wiring crossing over a wiring layer. In addition, two types of reactive gas are required one for a connection wiring and the other for an insulation pattern. Furthermore, the reactive gas for an insulating pattern ($SiO_2$) is silan ($SiH_4$) which is harmful. The conventional example of the improvement has another problem that insulation of an insulating pattern formed between a connection wiring and a wiring layer is not sufficient. In other words, the insulation characteristic of the insulating pattern formed by a reactive gas by using a FIB deteriorates due to an effect of impurity such as Ga in the order of one to two digits as compared with an ordinary $SiO_2$ film.

That is, while the conventional improved LSI wiring apparatus allows an aerial wiring connecting opposite side wirings crossing over an intermediate wiring layer when a plurality of wiring layers are arranged, the apparatus makes manufacturing steps complicated to deteriorate an insulation characteristic of an insulating pattern formed for the aerial wiring.

SUMMARY OF THE INVENTION

One object of the present invention is to prevent deterioration in an insulation characteristic of an aerial wiring in an apparatus for wiring a semiconductor device by using an energy beam.

Another object of the present invention is to simplify manufacturing steps in a method of wiring a semiconductor device by using an energy beam.

A further object of the present invention is to improve a mounting density of a LSI.

Briefly stated, according to a first aspect of the present invention, a first energy beam is generated by a first beam generator in an apparatus for wiring a semiconductor device. The first energy beam generated by the first beam generator is emitted by a first beam emitting device to form a first wiring. A second beam generator is disposed to generate a second energy beam at a position at which the emission direction thereof crosses the emission direction of the first energy beam generated by the first beam generator. The second energy beam generated from the second beam generator is emitted by a second beam emitting device to form a second wiring at the side surface of the first wiring. The first and the second beam emitting devices are controlled by an irradiation controller to control irradiation operations with the first and the second energy beams. As a result, such an insulation film formed by using an insulating reactive gas is not required for an aerial wiring as is necessary in the conventionally proposed example of an improvement.

According to a second aspect of the present invention, in a method of wiring a semiconductor device, a reactive gas which forms a conductive substance constituting a connection wiring through an irradiation with an energy beam is supplied to a position in the semiconductor device at which a connection wiring should be formed. A first energy beam is directed from the above onto a surface of a first wiring layer of the semiconductor device to form a first connection wiring portion on the first wiring layer. A second energy beam is directed from the direction crossing the first energy beam onto the side surface portion of the first connection wiring portion to form a second connection wiring portion and extending from the first connection wiring portion in the direction horizontal to and spaced apart from the surface of the semiconductor device at a predetermined interval. The first energy beam is directed from the above onto a surface of a second wiring layer of the semiconductor device to form a third connection wiring portion on the second wiring layer so as to connect to the end portion of the second connection wiring portion. As a result, there is no need of adding a process of forming an insulation film for an aerial wiring as is required by a conventionally proposed example of an improvement.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
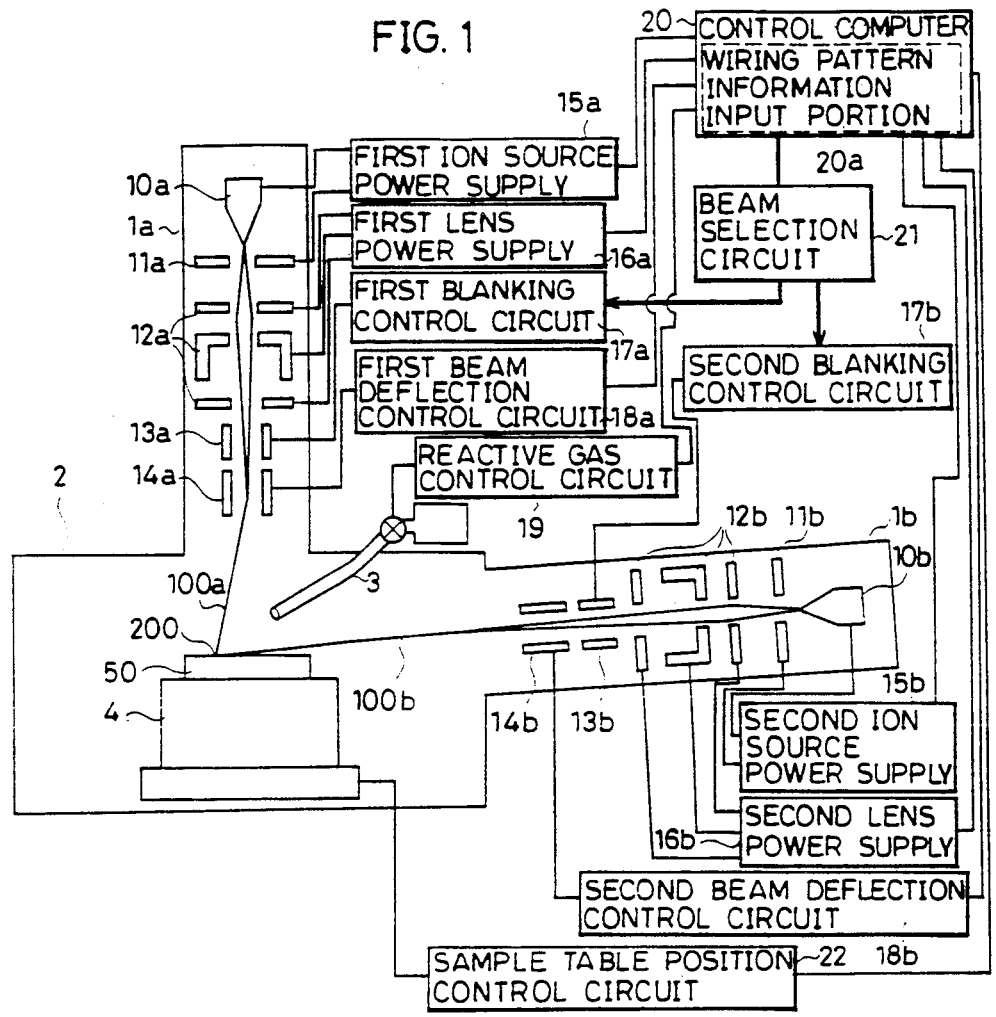
FIG. 1 is a schematic diagram showing an arrangement of an LSI wiring apparatus according to one embodiment of the present invention.

The embodiments of the present invention will be described in the following with reference to the drawings. With reference to FIG. 1, a LSI wiring apparatus comprises a first beam column 1a for generating and emitting a first focused ion beam 100a, a sample chamber 2, a reactive gas nozzle 3 for supplying a reactive gas such as $W(CO)_6$ forming a connection wiring, a movably provided sample stage 4 provided with a substrate 50 thereon on which a connection wiring is formed, a second beam column 1b provided in the direction approximately perpendicular to first beam column 1a for generating and emitting a second focused ion beam 100b. First beam column 1a includes a first ion source 10a comprising a liquid metal ion source or the like, a first beam extracting electrode 11a for extracting an ion beam from first ion source 10a, a first electrostatic lens 12a for focusing the ion beam extracted by first beam extracting electrode 11a, a first beam deflector 14a for deflection-scanning first focused ion beam 100a focused by first electrostatic lens 12a onto an irradiation position 200 in substrate 50, and a first beam blanking electrode 13a for turning on/off first focused ion beam 100a. Similarly, second beam column 1b includes a second ion source 10b, a second beam extracting electrode 11b, a second electrostatic lens 12b, a second beam blanking electrode 13b and a second beam deflector 14b. First ion source 10a and first beam extracting electrode 11a are connected to a first ion source power supply 15a which is connected to a control computer 20. First electrostatic lens 12a is connected to a first lens power supply 16a which is connected to control computer 20. First beam deflector 14a is connected to a first beam deflection control circuit 18a which is connected to control computer 20. Like first beam column 1a having the respective components connected thereto, second beam column 1b is connected to a second ion source power supply 15b, a second lens power supply 16b and a second beam deflection control circuit 18b, all of which are connected to control computer 20.

First beam blanking electrode 13a of first beam column 1a is connected to a first blanking control circuit 17a and similarly, second beam blanking electrode 13b of second beam column 1b is connected to a second blanking control circuit 17b. Both first and second blanking control circuits 17a and 17b are connected to a beam selecting circuit 21 which is connected to control computer 20. Reactive gas nozzle 3 is connected to a reactive gas control circuit 19 which is connected to control computer 20. Sample table 4 is connected to a sample table position controlling circuit 22 which is connected to control computer 20.

As described in the foregoing, the present embodiment, with first beam column 1a provided in an approximately vertical direction to the surface of substrate 50 on which the connection wiring is formed and second beam column 1b provided horizontally to the surface of substrate 50, facilitates an aerial wiring which connects a plurality of wiring layers at the opposite sides to cross over an intermediate wiring layer as will be described later. In addition, the formation processes of the aerial wiring are carried out based on wiring pattern information applied to a wiring pattern information inputting portion 20a provided in control computer 20 in the present embodiment. In other words, first and second lens power supplies 16a and 16b, first and second blanking control circuits 17a and 17b, first and second beam deflection control circuits 18a and 18b, reactive gas control circuit 19, beam selecting circuit 21 and sample stage position controlling cirguit 22 are controlled according to the wiring pattern information supplied to wiring pattern information inputting portion 20a.

More specifically, a formation process is first determined according to the wiring pattern information supplied to wiring pattern information inputting portion 20 and then, a focused ion beam for irradiation in each process is selected by beam selection circuit 21 based on the determination. When beam selection circuit 21 selects first focused ion beam 100a, for example, such a signal is applied to first blanking control circuit 17a as controls first beam blanking electrode 13a to turn on first focused ion beam 100a. As a result, first focused ion beam 100a is turned on. Then, the irradiation position with focused ion beam 100a is controlled by first beam deflection control circuit 18a according to the wiring pattern information applied to wiring pattern information inputting portion 20a.

The amount of irradiation with first focused ion beam 100a is controlled by first blanking control circuit 17a according to the wiring pattern information. During the irradiation with first focused ion beam 100a, second focused ion beam 100b is turned off by second blanking control circuit 17b.

Figure 2:
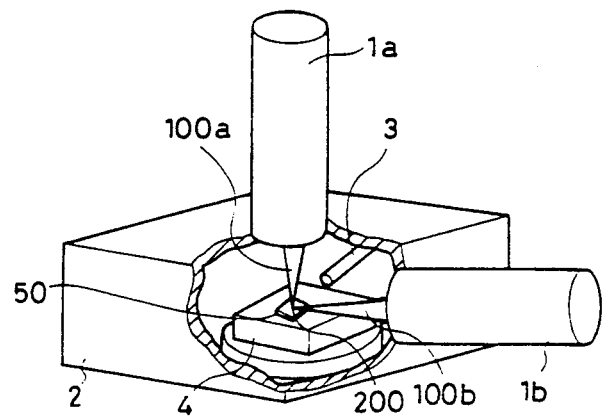
FIG. 2 is a perspective view of the LSI wiring apparatus shown in FIG. 1.

With reference to FIG. 2 showing an outer appearance of an actual LSI wiring apparatus, sample chamber 2 is filled with the reactive gas supplied by reactive gas nozzle 3. First focused ion beam 100a and second focused ion beam 100b are emitted from the above and from the side, respectively, of substrate 50 disposed on sample stage 4 movably provided in sample chamber 2.

With reference to FIGS. 1 to 5, the wiring forming operations by the LSI wiring apparatus according to the present embodiment will be described. First, with reference to FIG. 3C, description will be given of a formation of an aerial wiring comprising a first wiring portion 51, a second wiring portion 52 and a third wiring portion 53 obtained by connecting a wiring layer 50a and a wiring layer 50b crossing over a wiring layer 50c.

Figure 3A:
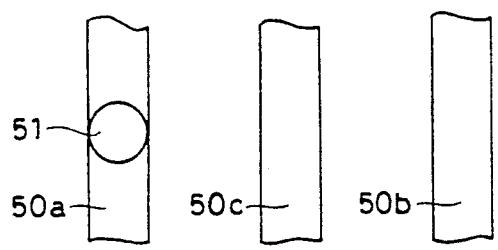
FIGS. 3A to 3C are diagrams showing a process explaining wiring forming operations of the LSI wiring apparatus shown in FIG. 1.
Figure 3B:
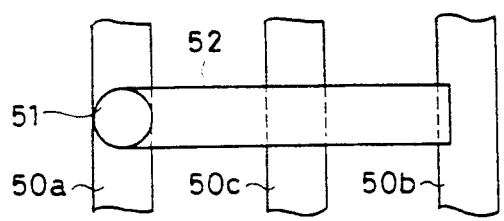
Figure 3C:
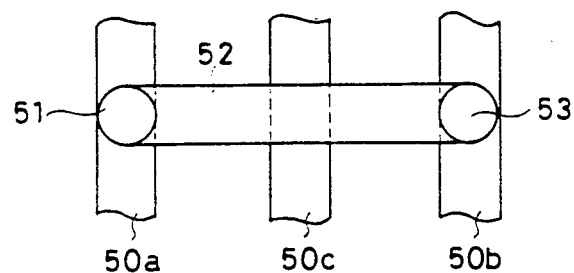
Figure 4:
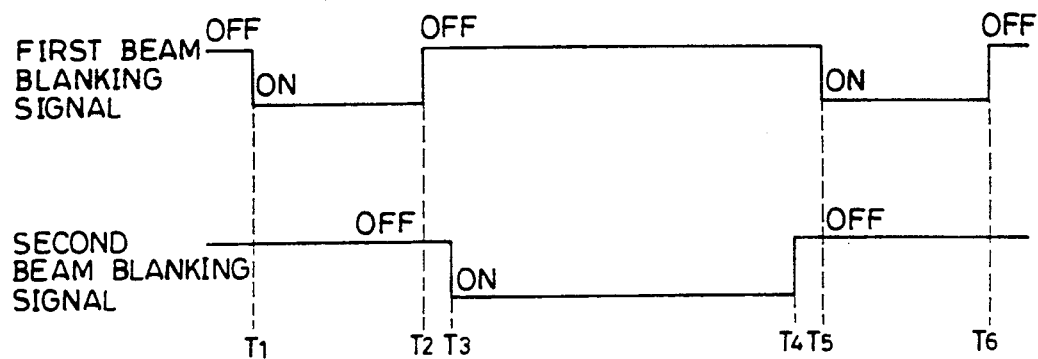
FIG. 4 is a timing chart showing a control signal for use in the wiring formation shown in FIGS. 3A to 3C.

First, the aerial wiring pattern data shown in FIG. 3C is input to wiring pattern information inputting portion 20a included in control computer 20 shown in FIG. 1. The wiring forming operation is performed based on the input of the aerial wiring pattern information. That is, the aerial wiring pattern input data to wiring pattern information inputting portion 20a (see FIG. 1) determines a wiring forming process and which focused ion beam (either first focused ion beam 100a or second focused ion beam 100b) should be used in each process. Such wiring forming operations as shown in FIGS. 3A to 3C are performed based on the determined wiring forming process. That is, as shown in FIG. 3A, first wiring portion 51 is first formed on wiring layer 50a by using first focused ion beam 100a. Then as shown in FIG. 3B, second wiring portion 52 is formed spaced apart from wiring layer 50c at a predetermined interval in the direction vertical to first wiring portion 51 by using second focused ion beam 100b.

As shown in FIG. 3C, third wiring portion 53 is formed on wiring layer 50b so as to connect the end portion of second wiring portion 52 again by using first focused ion beam 100a. The wiring forming processes shown in FIGS. 3A to 3C are carried out based on the control signal shown in FIG. 4. That is, a first beam blanking signal and a second beam blanking signal are applied as control signals. In the process shown in FIG. 3A, the first beam blanking signal is turned on from $T_1$ to $T_2$. In response thereto, first blanking control circuit 17a (see FIG. 1) turns on second beam blanking electrode 13b. As a result, focused ion beam 100a (see FIG. 1) is directed onto wiring layer 50a to form first wiring portion 51. The first beam blanking signal is turned off at the time point $T_2$ shown in FIG. 4 and in response thereto, first blanking control circuit 17a (see FIG. 1) turns off first focused ion beam 100a. The second beam blanking signal which has been turned off since $T_2$ is turned on at $T_3$. Upon the turning-on of the second beam blanking signal, the beam selection circuit (see FIG. 1) applies a control signal to the second blanking control circuit to turn on second focused ion beam 100b. Second focused ion beam 100b remains on until $T_4$ to form second wiring portion 52 as shown in FIG. 3B. After $T_4$, the first beam blanking signal is again turned on at $T_5$, whereby the same control operation as that during $T_1$-$T_2$ is performed to form third wiring portion 53 as shown in FIG. 3.

Figure 5:
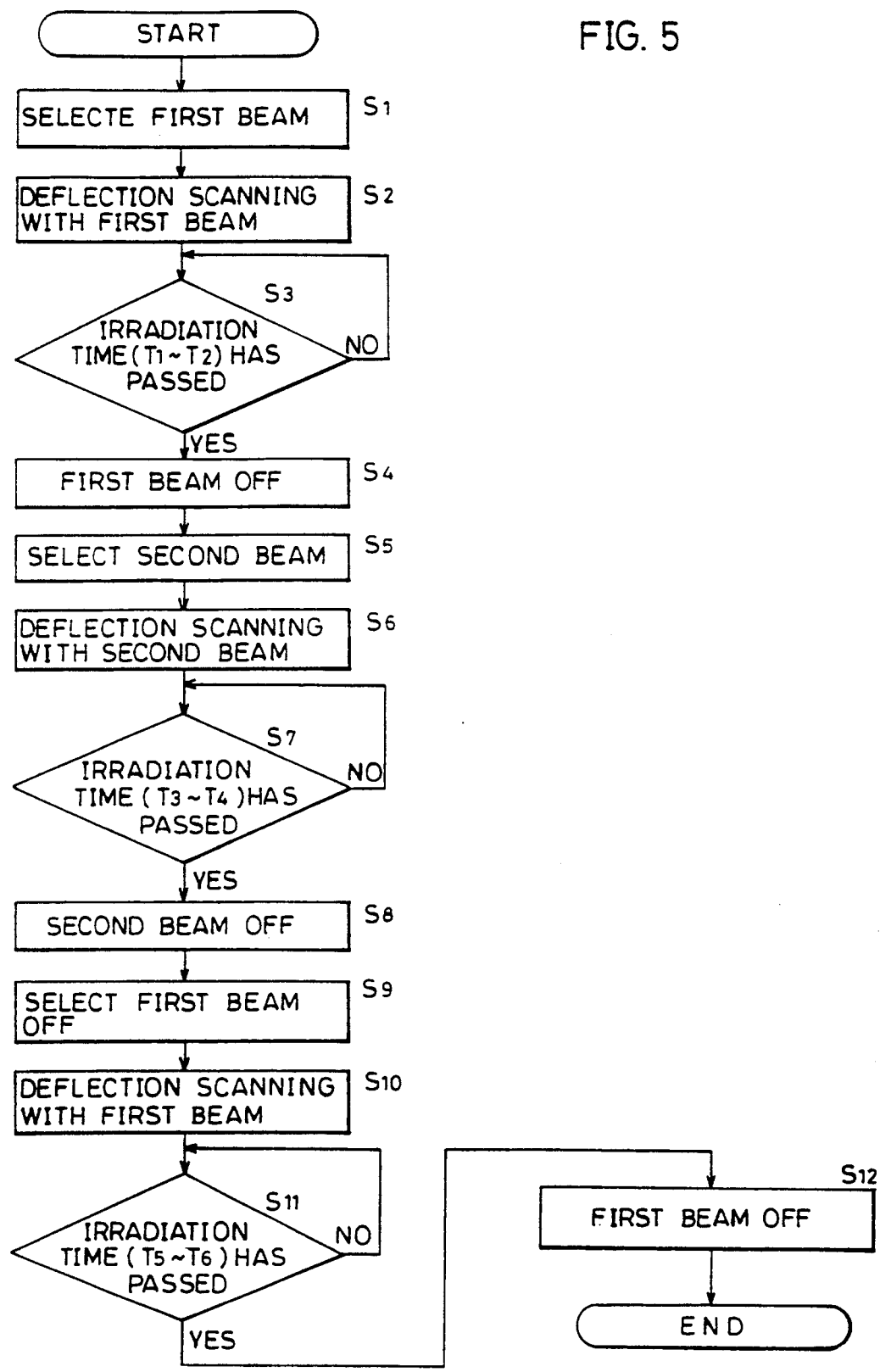
FIG. 5 is a flow chart explaining the operations of the wiring formation shown in FIGS. 3A to 3C.

The foregoing operation will be described following the flow chart shown in FIG. 5. First in step S1, a first beam is selected according to an aerial wiring pattern applied to wiring pattern information inputting portion 20a (see FIG. 1). In step S2, the first beam (first focused ion beam 100a (see FIG. 1)) is deflection-scanned on substrate 50 (see FIG. 1). In step S3, the determination is made as to whether the irradiation time ($T_1$-$T_2$) has passed or not and if it has not, the irradiation is continued. When the determination is made that the irradiation time has passed, it proceeds to step S4 wherein the first beam is turned off.

In step S5, the second beam (second focused ion beam 100b (see FIG. 1)) is selected. Then proceeding to Step S6, the deflection-scanning is carried out by the second beam. In step S7, the determination is made as to whether the irradiation time ($T_3$-$T_4$) has passed or not and if it has not, the irradiation is continued. When the determination is made in step S7 that the irradiation time has passed, it proceeds to step S8 wherein the second beam is turned off. Thereafter, it proceeds to step S9 wherein the first beam is again selected and then to step S10 wherein the deflection-scanning is performed by the first beam. In step S11, the determination is made as to whether the time ($T_5$-$T_6$) of irradiation with the first beam has passed or not, and if it has not, the irradiation is continued and when the determination is made that the irradiation time has passed, the first beam is turned off to finish the program.

Figure 6A:
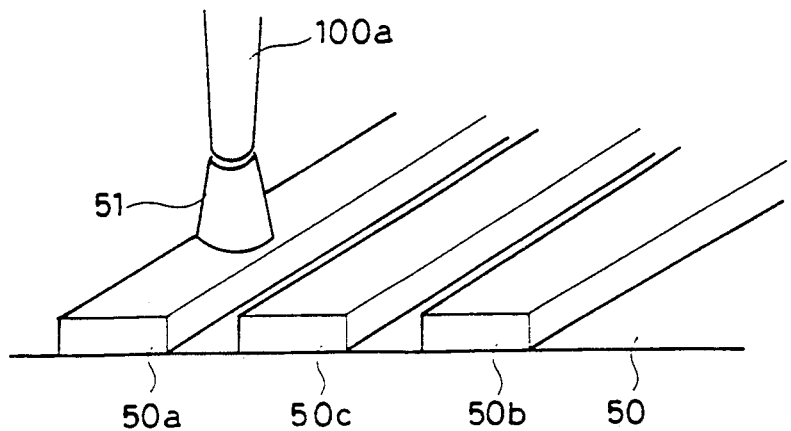
FIGS. 6A to 6C are diagrams of the formation process showing the wiring forming operations shown in FIG. 3A to 3C in three dimensions.
Figure 6B:
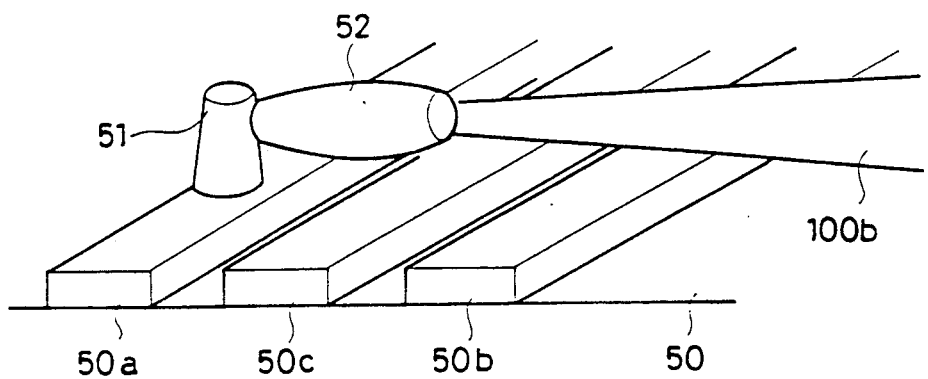
Figure 6C:
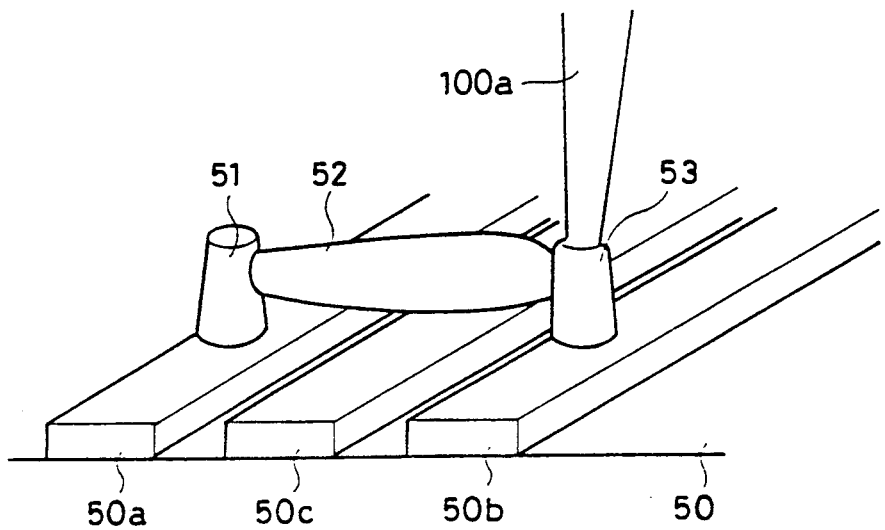

With reference to FIGS. 6A to 6C, first wiring portion 51 is vertically formed to a predetermined height on the surface of wiring layer 50a formed on substrate 50. Then, second wiring portion 52 is formed at the side portion of first wiring portion 51 in the direction approximately perpendicular to the direction of first wiring portion 51. Thereafter, similarly to the first wiring portion, third wiring portion 53 is formed on wiring layer 50b in the direction perpendicular to the surface of the same. In the present embodiment, $W(CO)_6$ is supplied as a reactive gas to the position where the first, the second and the third wiring portions are formed and first focused ion beam 100a and second focused ion beam 100b each having energy of 20 KeV, a diameter of 1 μm and a current of 3 nA are directed onto that position. By setting the irradiation amount of first focused ion beam 100a to about $2 \times 10^{18}$/cm$^2$, for example, first wiring portion 51 (see FIG. 6A) is formed comprising a conical W deposition of about 2 μm height.

As described in the foregoing, the present embodiment does not require formation of an insulating pattern between a wiring to be crossed over and an aerial wiring portion formed above the same as is necessary in a conventionally proposed example of an improvement. As a result, both problems of the conventionally proposed example of the improvement are resolved that an additional step of forming an insulating pattern complicates manufacturing steps and that an insulation characteristic of the insulating pattern formed by a reactive gas is deteriorated. With the focused ion beam under the above-described conditions, the irradiation amount for one second results in $2 \times 10^{18}$/cm$^2$, so that one aerial wiring can be formed in about 10 seconds to reduce a time required for forming wirings.

Figure 7:
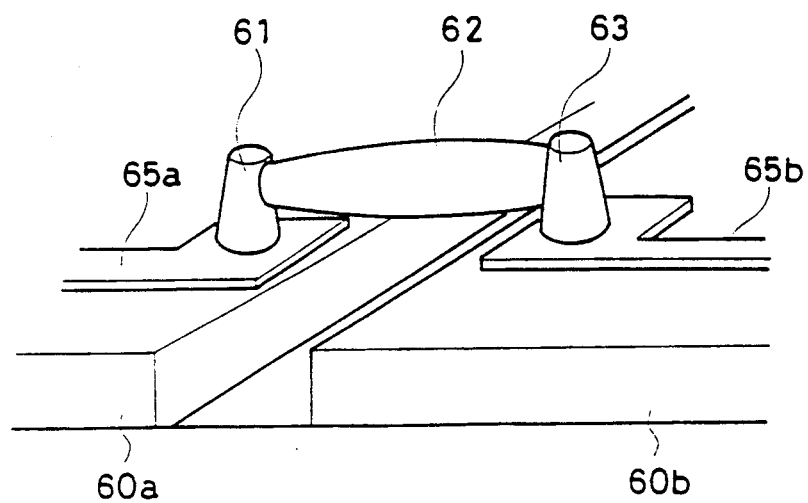
FIG. 7 is a perspective view showing a first embodiment of an aerial wiring formed by the LSI wiring apparatus shown in FIG. 1.

With reference to FIG. 7, an aerial wiring is formed between different LSI chips 60a and 60b in the first embodiment. That is, a first wiring portion 61 and a third wiring portion 63 are formed on a wiring layer 65a formed on LSI chip 60a and a wiring layer 65b formed on LSI chip 60b, respectively, and first wiring portion 61 and third wiring portion 63 are connected by means of a second wiring portion 62. The LSI wiring apparatus shown in FIG. 1, capable of connecting other LSI chips by forming very narrow wiring portions each having one side of about several μm, allows a mounting density of the LSI to be significantly improved to obtain an electronic circuit of extremely high performance as compared with a conventional circuit even though they are of the same size.

Figure 8:
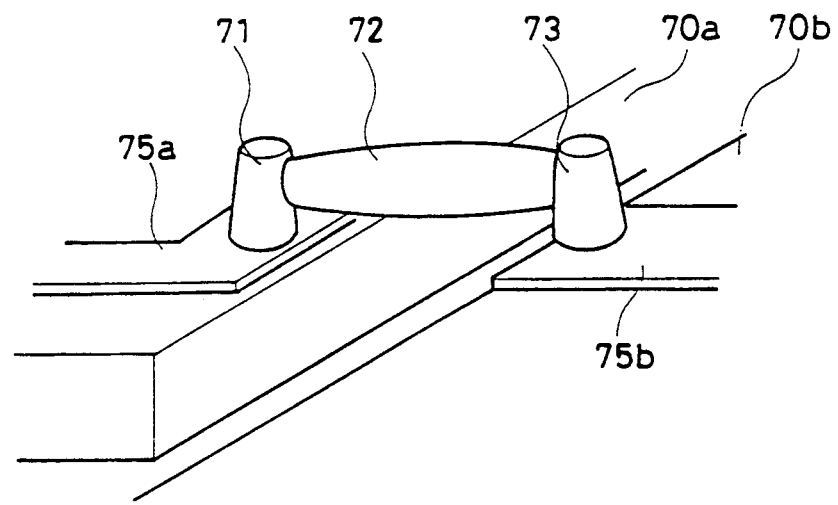
FIG. 8 is a perspective view showing a second embodiment of an aerial wiring formed by the LSI wiring apparatus shown in FIG. 1.
Figure 9:
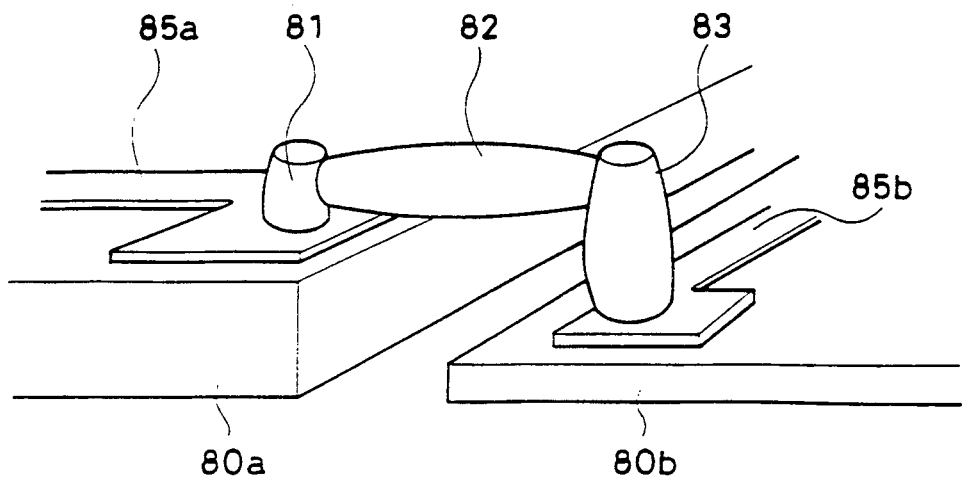
FIG. 9 is a perspective view showing a third embodiment of an aerial wiring formed by the LSI wiring apparatus shown in FIG. 1.

With reference to FIG. 8, an aerial wiring is formed between a LSI chip 70a and a package 70b in the second embodiment. That is, a first wiring portion 71 and a third wiring portion 73 are formed to connect a wiring layer 75a formed on LSI chip 70a and a wiring layer 75b formed on package 70b, and first wiring portion 71 and third wiring portion 73 are connected by means of a second wiring portion 72.

The third embodiment is an aerial wiring formed connecting wiring layers 85a and 85b of different height. That is, while a LSI chip 80a and a LSI chip 80b are provided on different levels, an aerial wiring comprising a first wiring portion 81, a second wiring portion 82 and a third wiring portion 83 can be easily formed by making third wiring portion 83 formed on a wiring layer 85b on LSI chip 80b larger in height than first wiring portion 81 formed on a wiring layer 85a on LSI chip 80a. The increased height of third wiring portion 83 can be easily obtained by setting the time of irradiation with first focused ion beam 100a (see FIG. 1) longer than that for forming first wiring portion 81.

Figure 10:
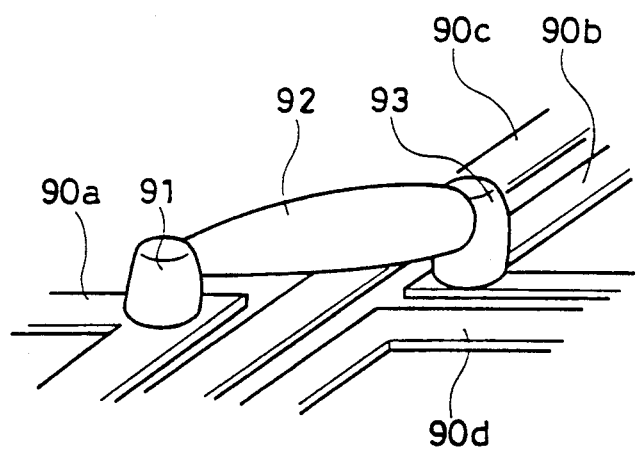
FIG. 10 is a perspective view showing a fourth embodiment of an aerial wiring formed by the LSI wiring apparatus shown in FIG. 1.
Figure 11:
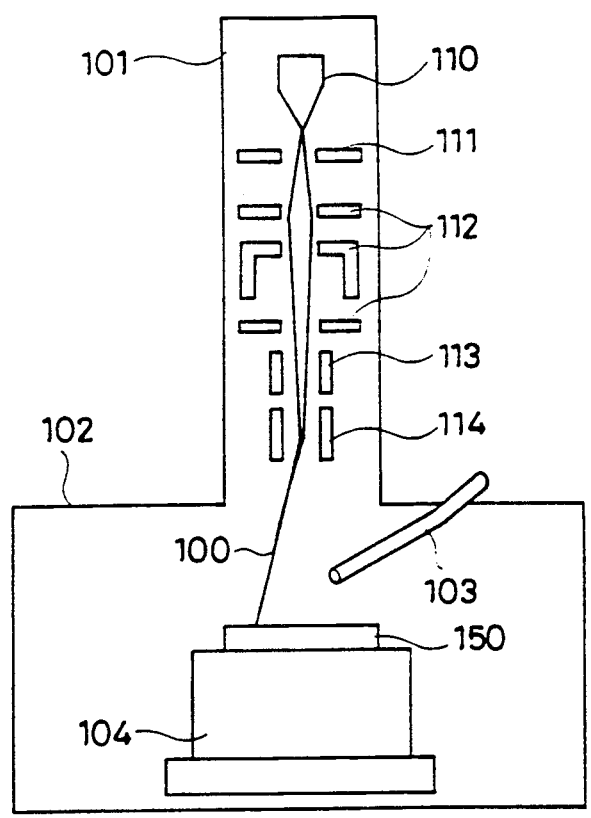
FIG. 11 is a schematic view showing an arrangement of a conventional LSI wiring apparatus.
Figure 12A:
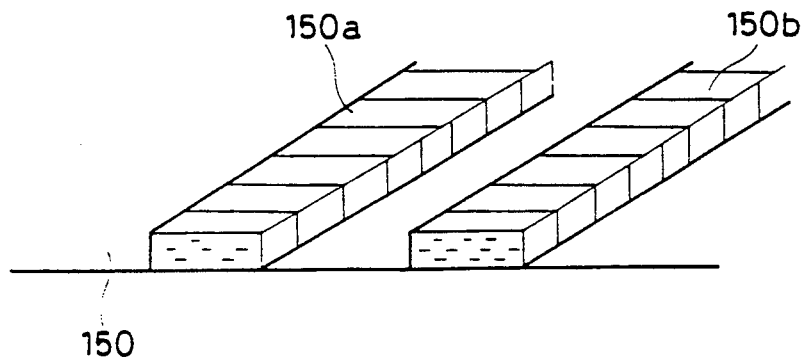
FIGS. 12A to 12C are diagrams of the formation process showing in third dimensions the wiring forming operation by using the conventional LSI wiring apparatus shown in FIG. 11.
Figure 12B:
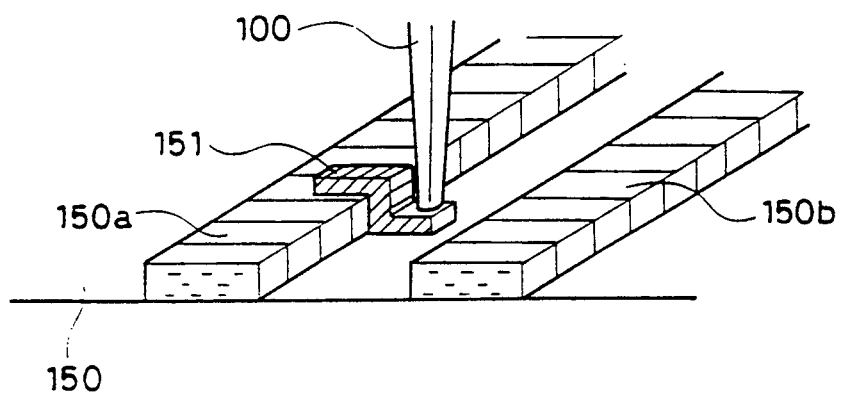
Figure 12C:
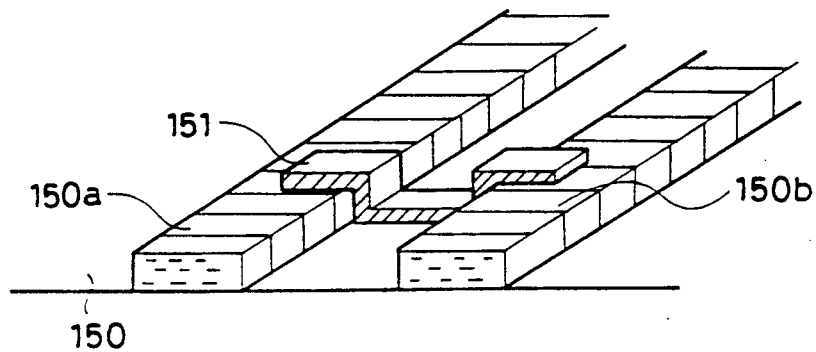
Figure 13A:
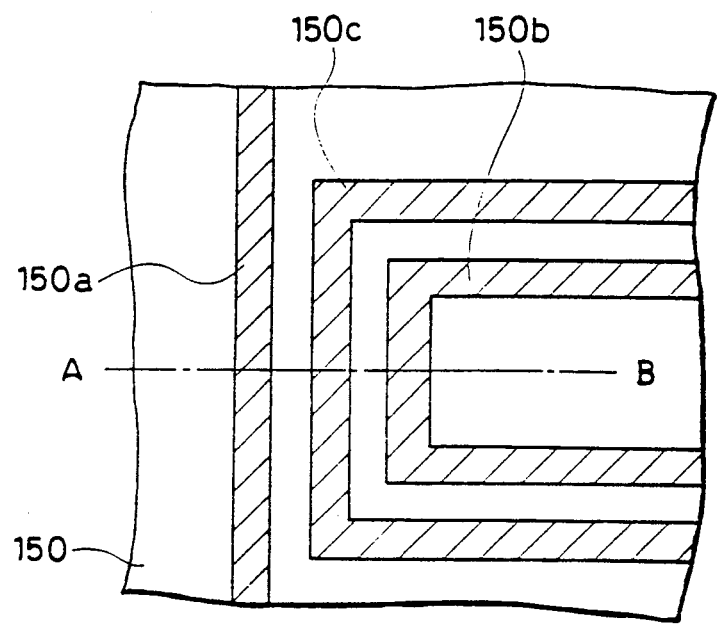
FIG. 13A is a plan view of a wiring layer explaining the problem of the conventional LSI wiring apparatus.
Figure 13B:
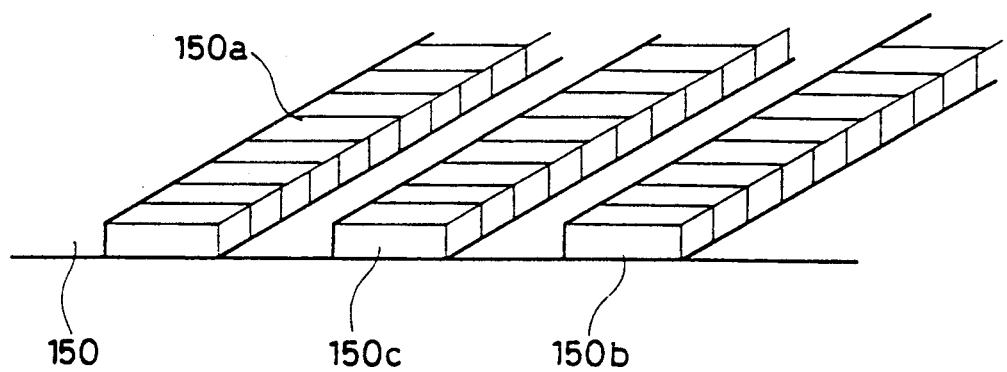
FIG. 13B is a perspective view of the wiring layer shown in FIG. 13A.
Figure 14A:
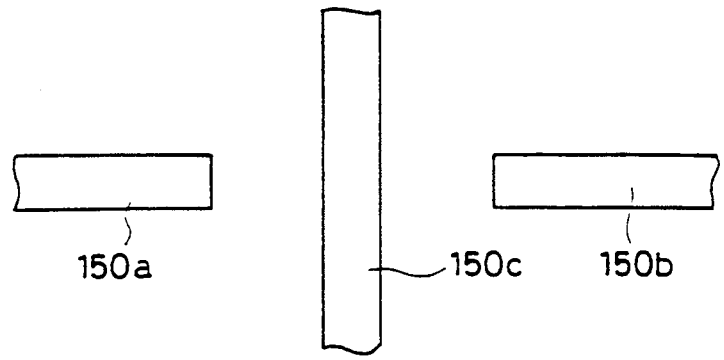
FIGS. 14A to 14C are diagrams of the formation process explaining wiring forming operations of a conventional improved LSI wiring apparatus.
Figure 14B:
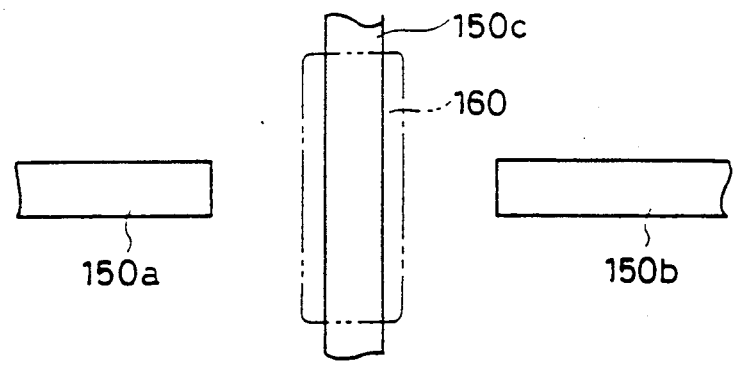
Figure 14C:
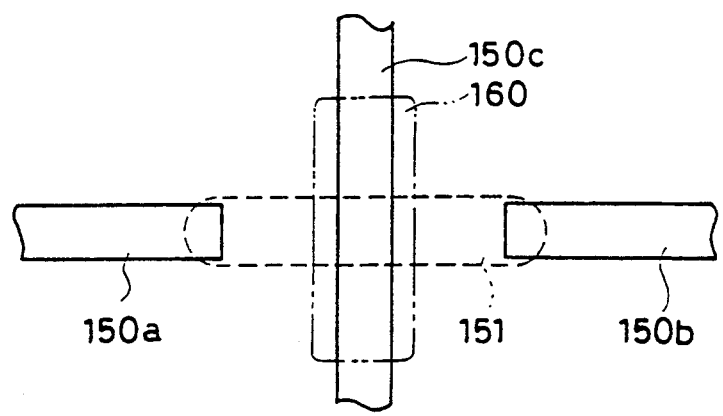

With reference to FIG. 10, the forth embodiment is an aerial wiring between wiring layers 90a and 90b arranged diagonally to each other to cross over a wiring layer 90c, where wiring layers 90a, 90b, 90c and 90d are provided. The aerial wiring comprising first, second and third wiring portions 91, 92 and 93 formed between the diagonally arranged wiring layers 90a and 90b as described above can be easily achieved by rotating sample stage 4 as shown in FIG. 1.

While in the present embodiment, the focused ion beam comprising Ga of 20 KeV is utilized as a focused ion beam for forming an aerial wiring, the present invention is not limited thereto but other types of focused ion beams can be used. In addition, while the present invention is directed to the device forming an aerial wiring by using a focused ion beam and the method therefor, the present invention is not limited thereto but the same effect can be obtained by using a laser beam in place of a focused ion beam, provided that reduction in the width of the aerial wiring is not so severe. Furthermore, while the present embodiment uses a reactive gas comprising $W(CO)_6$ as a reactive gas forming an aerial wiring, the present invention is not limited thereto but any reactive gas can be used which is decomposed by energy of ion beam irradiation to form a conductive material. For example, tungsten hexafluoride ($WF_6$) or trimethylaluminum $[Al(CH_3)_3]$ can also be used.

As described above, the LSI wiring apparatus shown in FIG. 1 requires no formation of an insulating pattern for aerial wirings by using a reactive gas which is necessary in a conventionally proposed example of the improvement, which results in avoiding deterioration of an insulation characteristic caused in the formation of insulating pattern by the reactive gas, because in the wiring apparatus, first beam column 1a is arranged above substrate 50 and second beam column 1b is arranged horizontally to the substrate, whereby the wiring portion formed upwardly on the wiring layer on substrate 50 is formed by first focused ion beam 100a emitted from first beam column 1a and the wiring portion formed in the direction horizontal to the wiring layer of substrate 50 of the aerial wiring is formed by second focused ion beam 100b emitted from second beam column 1b.

The LSI wiring method shown in FIGS. 6A to 6C includes the steps of supplying a reactive gas such as $W(CO)_6$ to a position of one of the wiring layers where an aerial wiring is to be formed among wiring layers 50a, 50c and 50b formed on substrate 50, forming first wiring portion 51 by directing first focused ion beam 100a onto wiring layer 50a, forming second wiring portion 52 by laterally directing second focused ion beam 100b onto the side of first wiring portion 51 and forming third wiring portion 53 by directing first focused ion beam 100a from the above of wiring layer 50b, to eliminate an additional process of forming an insulating film for an aerial wiring as is required in the conventionally proposed example of the improvement, thereby simplifying the manufacturing steps.

As described in the foregoing, first beam generating means generates a first energy beam in the wiring apparatus of the semiconductor device according to one embodiment of the present invention. The first energy beam generated by the first beam generating means is emitted for irradiation by beam emitting means to form a first wiring. Second beam generating means for generating a second energy beam is disposed at such a position that the emission direction of the same crosses the emission direction of the first energy beam generated from the first beam generating means. The second energy beam generated from the second beam generating means is emitted for irradiation by second beam emitting means to form a second wiring on the side surface of the first wiring. The control of the irradiation operations with the first and the second energy beams are obtained through the control of the first and the second emitting means by the irradiation controlling means. As a result, there is no need of forming an insulating film for an aerial wiring by using an insulating reactive gas as is required in the conventionally proposed example of the improvement, so that an aerial wiring can be easily formed without deteriorating an insulation characteristic.

According to the method of wiring a semiconductor device of the present invention, such a reactive gas as forming a conductive substance constituting a connection wiring through irradiation with an energy beam is supplied to a position where a connection wiring of the semiconductor device should be formed. The surface of the first wiring layer of the semiconductor device is irradiated with the first energy beam from above to form the first connection wiring portion on the first wiring layer. The side surface portion of the first wiring portion is irradiated with the second energy beam from the direction crossing the first energy beam to form the second connection wiring portion spaced apart from the surface of the semiconductor device at a predetermined interval to extend from the first wiring portion in the direction horizontal to the surface of the semiconductor substrate. The surface of the second wiring layer of the semiconductor device is irradiated with the first energy beam from above to form the third connection wiring portion on the second wiring layer so as to connect with the end portion of the second connection wiring portion. As a result, no additional step is required for forming an insulating film for an aerial wiring as is required in the conventionally proposed example of the improvement, which allows an aerial wiring to be easily formed without complicating the manufacturing steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device wiring apparatus for forming a wiring on a semiconductor device through irradiation with an energy beam by supplying such a reactive gas as forms a conductive material constituting a wiring by irradiation with an energy beam, said semiconductor device wiring apparatus comprising:

first beam generating means for generating said first energy beam, first beam emitting means for emitting the first energy beam generated by said first beam generating means to form a first wiring, second beam generating means for generating a second energy beam disposed at such a position that the emission direction of the same crosses the emission direction of the first energy beam generated from said first beam generating means, second beam emitting means for emitting the second energy beam generated from said second beam generating means to form a second wiring on the side surface of said first wiring, and emission controlling means for controlling said first and second beam emitting means to control irradiation operations with said first and second energy beams.

2. The semiconductor device wiring apparatus according to claim 1, wherein said first beam generating means and said first beam emitting means are provided above the semiconductor device in a direction approximately vertical to said semiconductor device surface, said second beam generating means and said second beam emitting means are provided horizontally to said semiconductor device in the direction horizontal to said semiconductor device.

3. The semiconductor device wiring apparatus according to claim 1, wherein said emission controlling means includes emission order controlling means for controlling said first and second emitting means to alternately perform irradiation.

4. The semiconductor device wiring apparatus according to claim 1, wherein said emission controlling means includes emission time controlling means for controlling emission times of said first and second emitting means.

5. The semiconductor device wiring apparatus according to claim 1, wherein said first and second beam emitting means includes:

beam cutting off means for cutting off said first and second energy beams, and beam scanning means for scanning with said first and second energy beams.

6. The semiconductor device wiring apparatus according to claim 1, wherein each of said first and second energy beams generated by said first and second beam generating means include a focused ion beam.

7. The semiconductor device wiring apparatus according to claim 1, wherein each of said first and second beam generating means includes an ion source and a beam extracting electrode.

8. The semiconductor device wiring apparatus according to claim 1, wherein the reactive gas supplied from said gas supplying means includes $W(CO)_6$.

9. The semiconductor device wiring apparatus according to claim 5, wherein said beam cutting off means includes a beam blanking electrode and said beam scanning means includes a beam deflector.

* * * * *